US012155174B2

(12) United States Patent
Yawata et al.

(10) Patent No.: US 12,155,174 B2
(45) Date of Patent: Nov. 26, 2024

(54) DRIVE CIRCUIT

(71) Applicant: OMRON Corporation, Kyoto (JP)

(72) Inventors: Masaki Yawata, Kyoto (JP); Chihiro Miyahara, Kyoto (JP)

(73) Assignee: OMRON CORPORATION, Kyoto (JP)

( * ) Notice: Subject to any disclaimer, the term of this patent is extended or adjusted under 35 U.S.C. 154(b) by 561 days.

(21) Appl. No.: 17/630,190

(22) PCT Filed: Jul. 28, 2020

(86) PCT No.: PCT/JP2020/028853
§ 371 (c)(1),
(2) Date: Jan. 26, 2022

(87) PCT Pub. No.: WO2021/029218
PCT Pub. Date: Feb. 18, 2021

(65) Prior Publication Data
US 2022/0294183 A1    Sep. 15, 2022

(30) Foreign Application Priority Data

Aug. 9, 2019   (JP) .................................. 2019-147172

(51) Int. Cl.
*H01S 3/00* (2006.01)
*H01S 5/042* (2006.01)
(Continued)

(52) U.S. Cl.
CPC ............ *H01S 5/0428* (2013.01); *H01S 5/042* (2013.01); *H01S 5/062* (2013.01); *H01S 5/06216* (2013.01); *H01S 5/4025* (2013.01); *H03K 3/017* (2013.01)

(58) Field of Classification Search
CPC ........ H01S 5/0428; H01S 5/042; H01S 5/062; H01S 5/06216; H01S 5/4025
See application file for complete search history.

(56) References Cited

U.S. PATENT DOCUMENTS 9,461,642 B1 * 10/2016 Pickens .................. H03K 3/013
9,966,837 B1 *  5/2018 Seaton .................... H02M 1/32
(Continued)

FOREIGN PATENT DOCUMENTS

JP        S622580 A      1/1987
JP    H01251679 A     10/1989
(Continued)

OTHER PUBLICATIONS

Extended European Search Report issued in European Appln. No. 20853407.3 mailed Jul. 21, 2023.
(Continued)

*Primary Examiner* — Kinam Park
(74) *Attorney, Agent, or Firm* — ROSSI, KIMMS & McDOWELL LLP

(57) ABSTRACT

A drive circuit includes a GaN FET having a source connected to an anode of an LD and a drain connected to a power source of the LD, a gate drive having an output port connected to a gate of the GaN FET and a negative voltage port connected to the source of the GaN FET to receive an input voltage at a positive voltage port and output the input voltage from the output port in response to a signal with a predetermined level, a capacitor between the positive and negative voltage ports of the gate drive, a diode on a power source line connecting the positive voltage port of the gate drive and a VDD power source for outputting a voltage less than the breakdown voltage at a voltage Vgs of the GaN FET, and a semiconductor switch between the source of the GaN FET and the ground.

2 Claims, 5 Drawing Sheets

(51) Int. Cl.
*H01S 5/062* (2006.01)
*H01S 5/40* (2006.01)
*H03K 3/017* (2006.01)

(56) References Cited

U.S. PATENT DOCUMENTS

| | | | |
|---|---|---|---|
| 2009/0279069 A1 | 11/2009 | Jensen | |
| 2011/0317729 A1 | 12/2011 | Matsumoto et al. | |
| 2013/0241621 A1* | 9/2013 | Forghani-Zadeh | H03K 17/08122 327/315 |
| 2017/0085057 A1* | 3/2017 | Barnes | H01S 5/0428 |
| 2018/0278017 A1 | 9/2018 | Mignoli | |
| 2020/0076411 A1* | 3/2020 | Lee | H03K 3/356017 |
| 2020/0076415 A1* | 3/2020 | Lee | H03K 17/04123 |
| 2020/0076426 A1* | 3/2020 | Lee | H03K 17/08122 |
| 2020/0099244 A1* | 3/2020 | Glaser | H02J 7/345 |
| 2020/0343688 A1* | 10/2020 | Chapman | H03K 17/165 |

FOREIGN PATENT DOCUMENTS

| | | |
|---|---|---|
| JP | H0896394 A | 4/1996 |
| JP | 2006310684 A | 11/2006 |
| JP | 2009544022 A | 12/2009 |
| JP | 2011023474 A | 2/2011 |
| JP | 2011238821 A | 11/2011 |
| JP | 5509537 B2 | 6/2014 |
| JP | 2017216812 A | 12/2017 |

OTHER PUBLICATIONS

International Search Report issued in Intl. Appln. No. PCT/JP2020/028853 mailed Oct. 20, 2020. English translation provided.
Written Opinion issued in Intl. Appln. No. PCT/JP2020/028853 mailed Oct. 20, 2020. English translation provided.

* cited by examiner

DRIVE CIRCUIT

FIELD

The present invention relates to a drive circuit for driving a laser diode.

BACKGROUND

To drive laser diodes (hereafter, LDs) in pulses using electricity charged in a capacitor fed through a semiconductor switch (refer to Patent Literatures 1 and 2), the semiconductor switch may switch faster to provide more satisfactory pulse patterns. A GaN field-effect transistor (FET) may be used as a semiconductor switch for driving LDs in pulses.

A typical array of LDs uses a common cathode. To drive each LD in such a typical LD array in pulses independently and at high speed using a GaN FET, the source of the GaN FET is to be connected to the anode of each LD.

When the GaN FET with the source connected to the anode of an LD is turned on, a current flowing through the LD largely changes the anode potential (or the source potential of the GaN FET). The GaN FET has a low breakdown voltage at its voltage Vgs (about 6V). Controlling the voltage Vgs to be 6V or less while controlling the on-off state of the GaN FET connected to the anode of an LD has been difficult.

CITATION LIST

Patent Literature

Patent Literature 1: Japanese Unexamined Patent Application Publication (Translation of PCT Application) No. 2009-544022
Patent Literature 2: Japanese Patent No. 5509537

SUMMARY

Technical Problem

In response to the above issue, one or more aspects of the present invention are directed to a drive circuit that satisfactorily drives a laser diode (LD) with its cathode connected to the ground (e.g., an LD in a common cathode LD array) using a GaN field-effect transistor (FET).

Solution to Problem

A drive circuit according to an aspect of the present invention is a drive circuit for driving a laser diode. The drive circuit includes a GaN field-effect transistor having a source connected to an anode of the laser diode and a drain connected to a power source of the laser diode, a gate drive having a positive voltage port, a negative voltage port connected to the source of the GaN field-effect transistor, an input port, and an output port connected to a gate of the GaN field-effect transistor to receive an input voltage at the positive voltage port and output the input voltage from the output port in response to a signal with a predetermined level input into the input port, a capacitor between the positive voltage port and the negative voltage port of the gate drive, a diode located on a power source line connecting the positive voltage port of the gate drive and a VDD power source to output a voltage less than a breakdown voltage at a gate-source voltage of the GaN field-effect transistor in a direction to interrupt a current flowing from the positive voltage port to the VDD power source, and a semiconductor switch to connect and disconnect the source of the GaN field-effect transistor to and from a ground.

More specifically, the drive circuit including the semiconductor switch turned on causes the capacitor functioning as a floating power source for the gate drive to be charged with an output voltage of the VDD power source set to be less than the breakdown voltage at the voltage Vgs of the GaN FET. The capacitor in the drive circuit has a low-potential terminal (or a terminal connected to the negative voltage port of the gate drive) connected to the source of the GaN FET (and to the anode of the laser diode). Thus, the drive circuit drives an LD in a common cathode LD array to control the voltage Vgs of the GaN FET to be less than the breakdown voltage at the voltage Vgs constantly (while the GaN FET is on or off).

Also, the semiconductor switch connects and disconnects the source of the GaN FET (or a terminal connected to the low-potential terminal of the capacitor) to and from the ground to allow the capacitor as the floating power source to be stably charged for each operation.

The drive circuit may use an external device or circuit to control the on-off state of the semiconductor switch and the on-off state of the GaN FET (or control the level of a control signal for the gate drive). The drive circuit may further include a controller to provide, after controlling the semiconductor switch to be on for a first predetermined time, a signal with a predetermined level to the input port of the gate drive for a second predetermined time.

Advantageous Effects

The drive circuit according to the above aspect of the present invention can satisfactorily drive an LD or other devices in a common cathode LD array using a GaN FET.

BRIEF DESCRIPTION OF THE DRAWINGS

FIG. 4 is a diagram describing a current path of the drive circuit according to the embodiment in which a FET #2 is on.
FIG. 5 is a diagram describing a current path of the drive circuit according to the embodiment in which a FET #1 is on.

DETAILED DESCRIPTION

Embodiments of the present invention will now be described with reference to the drawings.

Figure 1:
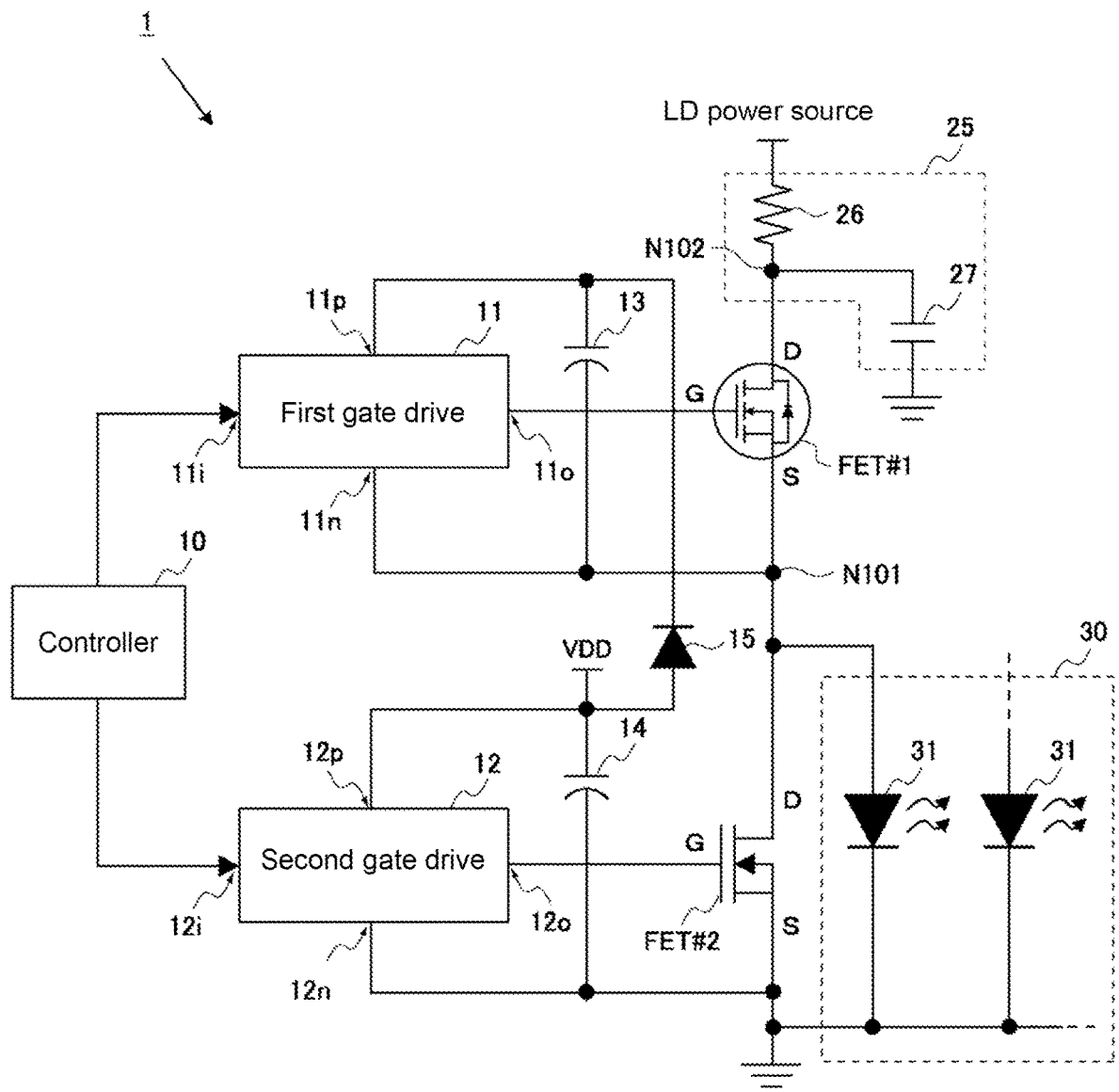
FIG. 1 is a diagram of a drive circuit according to one embodiment of the present invention.

FIG. 1 is a diagram of a laser diode (LD) drive circuit 1 according to one embodiment of the present invention. The LD drive circuit 1 according to the present embodiment is designed to be arranged for each laser diode 31 included in a laser diode array 30. As illustrated, the drive circuit includes a controller 10, a first gate drive 11, a second gate drive 12, a field-effect transistor (FET) #1, a FET #2, a capacitor 13, a bypass capacitor 14, a diode 15, and a laser drive power source 25.

The laser drive power source 25 supplies power for driving the LD 31 (causing the LD 31 to emit light). The laser drive power source 25 includes a resistor 26 and a capacitor 27. The capacitor 27 is charged with a voltage of about several tens to one hundred volts applied from an LD power source through the resistor 26.

The FET #1 is a GaN FET for feeding a current (charge) to the LD 31 from the capacitor 27. The FET #1 has its drain connected to an output terminal of the laser drive power source 25, and its gate connected to an output port 11o of the first gate drive 11. The FET #1 has its source connected to the anode of an LD 31, a negative voltage port 11n of the first gate drive 11, and other devices. Hereafter, the output terminal of the laser drive power source 25 (the node between the laser drive power source 25 and the drain of the FET #1) is referred to as a node N102, and the node between the source of the FET #1 and the negative voltage port 11n of the first gate drive 11 is referred to as a node N101.

The FET #2 is a metal-oxide-semiconductor (MOS) FET for connecting and disconnecting the negative voltage port 11n of the first gate drive 11 (and the anode of the LD 31, the drain of the FET #2, and a negative terminal of the capacitor 13) to and from the ground. The FET #2 has its drain connected to the source of the FET #1 (and to the negative voltage port 11n of the first gate drive 11 and other devices), its gate connected to an output port 12o of the second gate drive 12, and its source connected to the ground. The FET #2 may be any semiconductor switch that can connect and disconnect the negative voltage port 11n to and from the ground. The FET #2 may not be a MOSFET, and may be, for example, a GaN FET.

The second gate drive 12 has a positive voltage port 12p, a negative voltage port 12n, an input port 12i, and the output port 12o. The second gate drive 12 receives an input voltage at the positive voltage port 12p and outputs the input voltage from the output port 12o in response to a signal with a predetermined level (high level in the present embodiment) input into the input port 12i. The second gate drive 12 has the positive voltage port 12p connected to a VDD power source, and the negative voltage port 12n connected to the ground. The output voltage of the VDD power source (hereafter also simply referred to as the VDD) may be less than the breakdown voltage at the voltage Vgs (e.g., 5V) of the FET #1 (GaN FET) at or below which the second gate drive 12 is operable. The second gate drive 12 may be a circuit similar to a common gate driver (e.g., a push-pull circuit including two MOSFETs). As shown in FIG. 1, the bypass capacitor 14 is located between the VDD power source and the ground.

Figure 2:
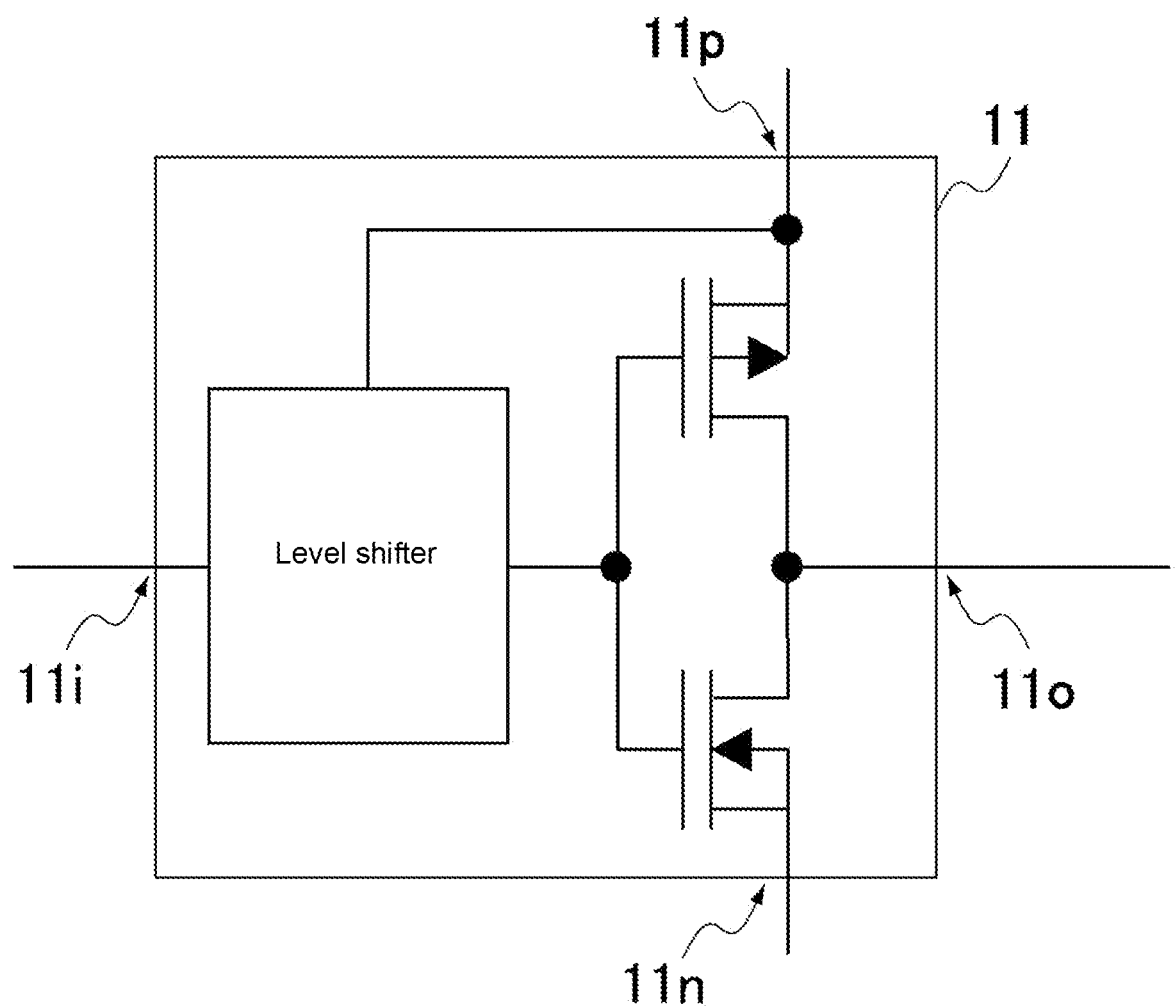
FIG. 2 is a diagram of a first gate drive showing an example structure.

The first gate drive 11 has a positive voltage port 11p, the negative voltage port 11n, an input port 11i, and the output port 11o. The first gate drive 11 receives an input voltage at the positive voltage port 11p and outputs the input voltage from the output port 11o in response to a signal with a predetermined level (high level in the present embodiment) input into the input port 11i. FIG. 2 shows an example structure of the first gate drive 11.

As shown in FIG. 1, the capacitor 13 is located between the positive voltage port 11p and the negative voltage port 11n of the first gate drive 11. The positive voltage port 11p of the first gate drive 11 and the VDD power source are connected with a power source line in which the diode 15 is placed to interrupt a current flowing from the positive voltage port 11p to the VDD power source. As described above, the first gate drive 11 has the negative voltage port 11n connected to the source of the FET #1, the drain of the FET #2, and the anode of the LD 31.

As described above, the first gate drive 11 has the potential of the positive voltage port 11p and the potential of the negative voltage port 11n that change together in response to the FET #1 being on. Thus, the first gate drive 11 may be, for example, a circuit having the structure shown in FIG. 2, or more specifically, a circuit including a push-pull circuit with two MOSFETs and a level shifter for changing an input voltage to the gate of each MOSFET in the push-pull circuit in accordance with the potential of the positive voltage port 11p.

The controller 10 is designed for driving the laser and uses a control signal with a high level for the second gate drive 12 for a first set time, waits for elapse of a second set time, and then uses a control signal with a high level for the first gate drive 11 for a third set time. The first to third set times are defined by a user. The first set time is defined in accordance with a time period taken for charging the capacitor 13. The second set time is defined in accordance with a time period for turning off the FET #2. The third set time is defined as a time period longer than or equal to a laser pulse width (or more specifically a time period taken for the capacitor 27 to be fully discharged). The timing at which signals are set at a high level determines the timing at which the laser emits light.

The controller 10 has an operation mode for driving the laser in response to every input of an external predetermined instruction and an operation mode for repeatedly driving the laser at preset intervals.

The drive circuit according to the present embodiment has the structure described above. The drive circuit according to the present embodiment can thus drive the LD 31 while controlling the voltage Vgs of the FET #1 (GaN FET) to be less than or equal to the breakdown voltage at the voltage Vgs.

Figure 3:
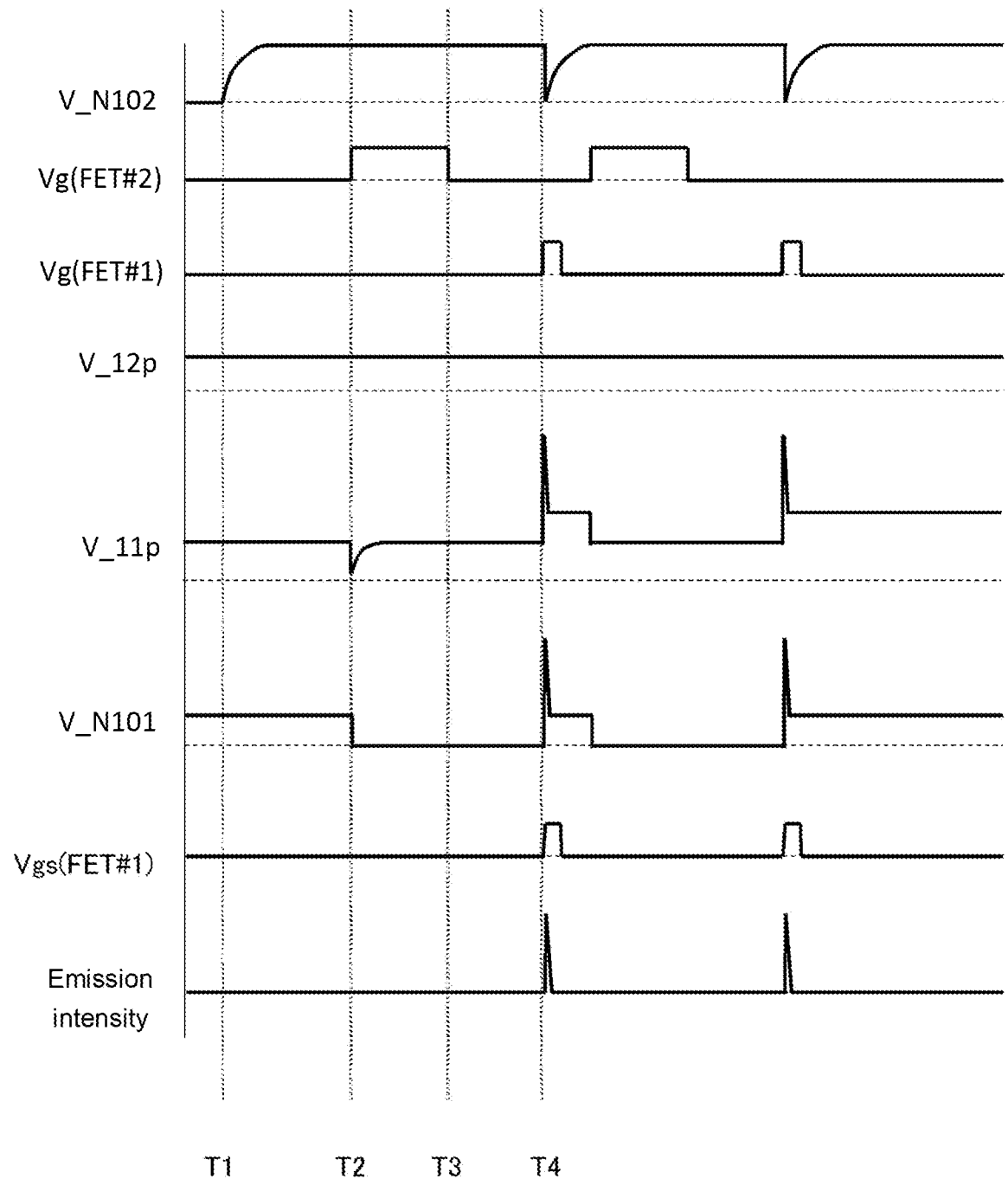
FIG. 3 is a timing chart of an operation of the drive circuit according to the embodiment.
Figure 4:
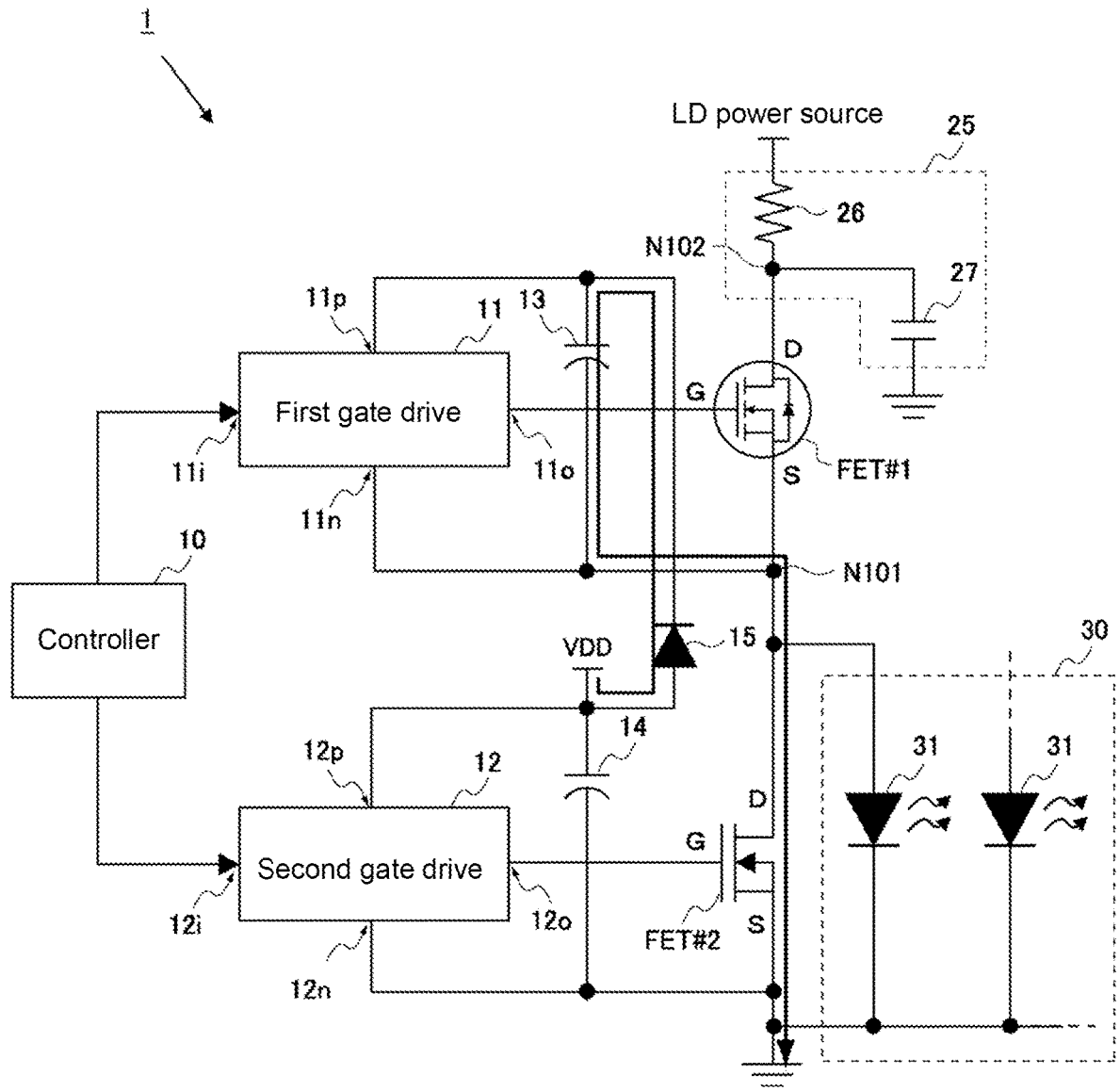
Figure 5:
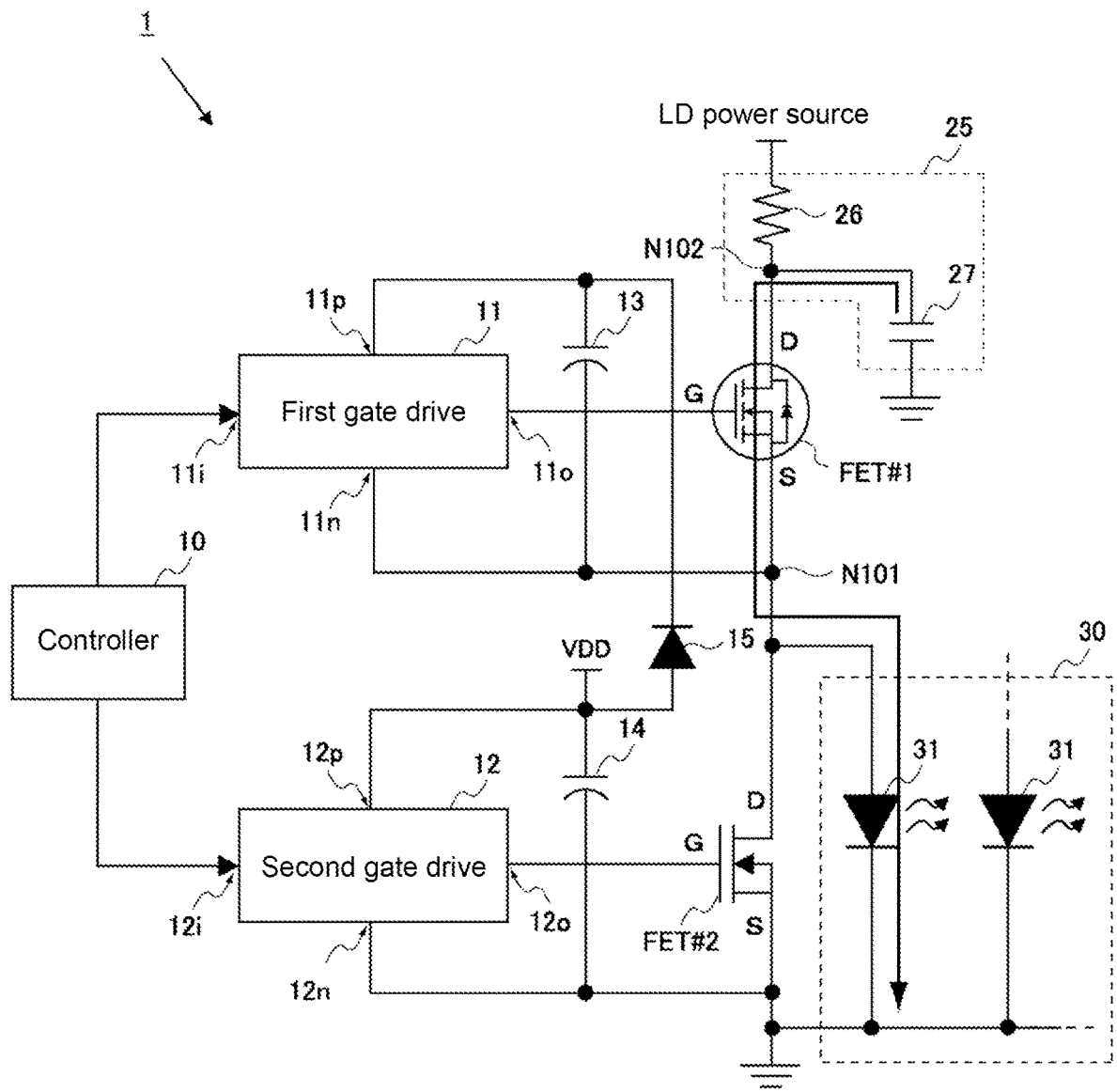

An operation example of the drive circuit according to the present embodiment will now be described with reference to FIGS. 3 to 5. FIG. 3 is a timing chart of an operation of the drive circuit according to the present embodiment. FIG. 4 is a diagram describing a current path of the drive circuit according to the present embodiment in which the FET #2 is on. FIG. 5 is a diagram describing a current path of the drive circuit according to the present embodiment in which the FET #1 is on. In the example below, after the VDD power source starts feeding power, the LD power source starts feeding power at a time T1 with the FETs #1 and #2 off and the capacitor 27 uncharged. The potential at the node N101 is nota ground potential.

As shown in FIG. 3, the LD power source starts feeding power at the time T1, and the capacitor 27 starts charging. This increases a potential V_N102 at the node N102, causing the potential V_N102 to be the potential of the LD power source in a predetermined time.

The controller 10 turns on the FET #2 at the time T2 to cause a potential V_N101 at the node N101 to be a ground potential. A current also flows along the path shown in FIG. 4. The capacitor 13 is thus charged to have the voltage between its terminals substantially equal to VDD (in other words, a voltage less than or equal to the breakdown voltage at the voltage Vgs).

The FET #2 is turned off at a time T3 after the capacitor 13 is fully charged. When the FET #1 is turned on at a time T4, a current flows along the path shown in FIG. 5 to cause the LD 31 to emit pulsed light. The first gate drive 11 operates using the capacitor 13 as a power source with the negative voltage port 11n connected to the node N101. As shown in FIG. 3, the voltage Vgs of the FET #1 is constantly (while the FET #1 is on or off) controlled to be less than or equal to the breakdown voltage at the voltage Vgs.

As described above, the LD drive circuit 1 according to the present embodiment can satisfactorily drive the LD with the cathode connected to the ground (e.g., an LD 31 in the common cathode LD array 30) using the GaN FET. The LD drive circuit 1 according to the present embodiment can be used in high-performance devices with pulsed laser light (e.g., distance-measuring devices such as light detection and ranging or LiDAR and machining devices).

Modifications

The drive circuit in the embodiment described above may be modified variously. For example, the drive circuit may be a circuit without the controller 10 (more specifically, a circuit receiving external control signals input into the first gate drive 11 and the second gate drive 12). The drive circuit may be a circuit without the controller 10 and the second gate drive 12 (more specifically, a circuit receiving external control signals input into the first gate drive 11 and the FET #2). The drive circuit may not include the bypass capacitor 14. The drive circuit may include a resistor between the diode 15 and the positive voltage port 11p. The circuit structure of the first gate drive 11 may not be limited to the above example.

APPENDIX

A drive circuit (1) for driving a laser diode (31), the drive circuit (1) comprising:
  a GaN field-effect transistor (FET #1) having a source connected to an anode of the laser diode (31) and a drain connected to a power source (25) of the laser diode (31);
  a gate drive (11) having a positive voltage port (11p), a negative voltage port (11n), an input port (11i), and an output port (11o), the gate drive (11) being configured to receive an input voltage at the positive voltage port (11p) and output the input voltage from the output port (11o) in response to a signal with a predetermined level input into the input port (11i), the output port (11o) being connected to a gate of the GaN field-effect transistor (FET #1), the negative voltage port being connected to the source of the GaN field-effect transistor (FET #1);
  a capacitor (13) between the positive voltage port (11p) and the negative voltage port (11n) of the gate drive (11);
  a diode (15) located on a power source line connecting the positive voltage port (11p) of the gate drive (11) and a VDD power source configured to output a voltage less than a breakdown voltage at a gate-source voltage of the GaN field-effect transistor (FET #1) in a direction to interrupt a current flowing from the positive voltage port (11p) to the VDD power source; and
  a semiconductor switch (FET #2) configured to connect and disconnect the source of the GaN field-effect transistor (FET #1) to and from a ground.

REFERENCE SIGNS LIST

1 LD drive circuit
10 controller
11p, 12p positive voltage port
11o, 12o output port
11i, 12i input port
11n, 12n negative voltage port
11 first gate drive
12 second gate drive
13, 27 capacitor
14 bypass capacitor
15 diode
25 laser drive power source
26 resistor
30 laser diode array
31 laser diode

The invention claimed is:

1. A drive circuit for driving a laser diode, the drive circuit comprising:
  a GaN field-effect transistor having a source connected to an anode of the laser diode and a drain connected to a power source of the laser diode;
  a gate drive having a positive voltage port, a negative voltage port, an input port, and an output port, the gate drive being configured to receive an input voltage at the positive voltage port and output the input voltage from the output port in response to a signal with a predetermined level input into the input port, the output port being connected to a gate of the GaN field-effect transistor, the negative voltage port being connected to the source of the GaN field-effect transistor;
  a capacitor between the positive voltage port and the negative voltage port of the gate drive;
  a diode located on a power source line connecting the positive voltage port of the gate drive and a VDD power source configured to output a voltage less than a breakdown voltage at a voltage Vgs of the GaN field-effect transistor in a direction to interrupt a current flowing from the positive voltage port to the VDD power source; and
  a semiconductor switch configured to connect and disconnect the source of the GaN field-effect transistor to and from a ground.

2. The drive circuit according to claim 1, further comprising:
  a controller configured to provide, after controlling the semiconductor switch to be on for a first predetermined time, the signal with the predetermined level to the input port of the gate drive for a second predetermined time.

* * * * *